United States Patent
Varadarajan et al.

(10) Patent No.: US 10,037,905 B2
(45) Date of Patent: Jul. 31, 2018

(54) UV AND REDUCING TREATMENT FOR K RECOVERY AND SURFACE CLEAN IN SEMICONDUCTOR PROCESSING

(75) Inventors: Bhadri Varadarajan, Beaverton, OR (US); George A. Antonelli, Portland, OR (US); Bart van Schravendijk, Sunnyvale, CA (US)

(73) Assignee: Novellus Systems, Inc., Fremont, CA (US)

(*) Notice: Subject to any disclaimer, the term of this patent is extended or adjusted under 35 U.S.C. 154(b) by 284 days.

(21) Appl. No.: 12/646,830

(22) Filed: Dec. 23, 2009

(65) Prior Publication Data

US 2011/0111533 A1    May 12, 2011

Related U.S. Application Data

(60) Provisional application No. 61/260,789, filed on Nov. 12, 2009.

(51) Int. Cl.
*H01L 21/67* (2006.01)
*H01L 21/02* (2006.01)
(Continued)

(52) U.S. Cl.
CPC .. *H01L 21/67115* (2013.01); *H01L 21/02063* (2013.01); *H01L 21/02074* (2013.01);
(Continued)

(58) Field of Classification Search
USPC ......................................... 438/637
See application file for complete search history.

(56) References Cited

U.S. PATENT DOCUMENTS 3,704,219 A    11/1972  McDowell
3,983,385 A    9/1976   Troue
(Continued)

FOREIGN PATENT DOCUMENTS

CN    1531749 A    9/2004
CN    1624895      6/2005
(Continued)

OTHER PUBLICATIONS

Cho et al., "Plasma Treatments of Molecularly Templated Nanoporous Silica Films," Electrochemical and Solid-State Letters, 4 (4) G35-G38 (2001).
(Continued)

*Primary Examiner* — Tony Tran
(74) *Attorney, Agent, or Firm* — Weaver Austin Villeneuve & Sampson LLP

(57) ABSTRACT

Treatment of carbon-containing low-k dielectric with UV radiation and a reducing agent enables process-induced damage repair. Also, treatment with a reducing agent and UV radiation is effective to clean a processed wafer surface by removal of metal oxide (e.g., copper oxide) and/or organic residue of CMP slurry from the planarized surface of a processed wafer with or without low-k dielectric. The methods of the invention are particularly applicable in the context of damascene processing to recover lost low-k property of a dielectric damaged during processing, either pre-metalization, post-planarization, or both, and/or provide effective post-planarization surface cleaning to improve adhesion of subsequently applied dielectric barrier and/or other layers.

5 Claims, 7 Drawing Sheets

(51) Int. Cl.
*H01L 21/3105* (2006.01)
*H01L 21/768* (2006.01)

(52) U.S. Cl.
CPC .... *H01L 21/3105* (2013.01); *H01L 21/76814* (2013.01); *H01L 21/76825* (2013.01); *H01L 21/76826* (2013.01); *H01L 21/76831* (2013.01); *H01L 21/76877* (2013.01); *H01L 21/76883* (2013.01)

(56) References Cited

U.S. PATENT DOCUMENTS

| | | |
|---|---|---|
| 4,313,969 A | 2/1982 | Matthews et al. |
| 4,357,451 A | 11/1982 | McDaniel |
| 4,391,663 A | 7/1983 | Hutter, III |
| 4,563,589 A | 1/1986 | Scheffer |
| 4,751,191 A | 6/1988 | Gonsiorawski et al. |
| 4,837,289 A | 6/1989 | Mueller et al. |
| 4,885,262 A | 12/1989 | Ting et al. |
| 4,927,786 A | 5/1990 | Nishida |
| 4,956,582 A | 9/1990 | Bourassa |
| 5,028,560 A | 7/1991 | Tsukamoto et al. |
| 5,174,881 A | 12/1992 | Iwasaki et al. |
| 5,178,682 A | 1/1993 | Tsukamoto et al. |
| 5,195,045 A | 3/1993 | Keane et al. |
| 5,249,076 A | 9/1993 | Fujiwara et al. |
| 5,268,320 A | 12/1993 | Holler et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,300,331 A | 4/1994 | Schaeffer |
| 5,314,538 A | 5/1994 | Maeda et al. |
| 5,364,667 A | 11/1994 | Rhieu |
| 5,407,524 A | 4/1995 | Patrick et al. |
| 5,413,664 A | 5/1995 | Yagi et al. |
| 5,504,042 A | 4/1996 | Cho et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,667,592 A | 9/1997 | Boitnott et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,840,600 A | 11/1998 | Yamazaki et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,015,503 A | 1/2000 | Butterbaugh et al. |
| 6,090,442 A | 7/2000 | Klaus et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |
| 6,228,563 B1 | 5/2001 | Starov et al. |
| 6,232,248 B1 | 5/2001 | Shinriki et al. |
| 6,239,018 B1 | 5/2001 | Liu et al. |
| 6,254,689 B1 | 7/2001 | Meder |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 | 9/2001 | Tolles |
| 6,329,017 B1 | 12/2001 | Liu et al. |
| 6,329,062 B1 | 12/2001 | Gaynor |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswamy et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,715 B1 | 9/2002 | Mukherjee et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,518,130 B1 | 2/2003 | Ohno |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,572,252 B1 | 6/2003 | Rangarajan et al. |
| 6,576,300 B1 | 6/2003 | Berry et al. |
| 6,596,467 B2 | 7/2003 | Gallagher et al. |
| 6,596,654 B1 | 7/2003 | Bayman et al. |
| 6,635,575 B1 | 10/2003 | Xia et al. |
| 6,644,786 B1 | 11/2003 | Leben |
| 6,677,251 B1 | 1/2004 | Lu et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,884,738 B2 | 4/2005 | Asai et al. |
| 6,899,857 B2 | 5/2005 | Pheng et al. |
| 6,902,440 B2 | 6/2005 | Dougan et al. |
| 6,921,727 B2 | 7/2005 | Chiang et al. |
| 6,958,301 B2 | 10/2005 | Kim et al. |
| 6,962,871 B2 | 11/2005 | Lee et al. |
| 6,967,160 B1 | 11/2005 | Paton et al. |
| 7,005,390 B2 | 2/2006 | Ramachandrarao et al. |
| 7,017,514 B1 | 3/2006 | Shepherd et al. |
| 7,018,918 B2 | 3/2006 | Kloster et al. |
| 7,025,831 B1 | 4/2006 | Butterbaugh et al. |
| 7,030,041 B2 | 4/2006 | Li et al. |
| 7,094,713 B1 | 8/2006 | Niu et al. |
| 7,097,712 B1 | 8/2006 | Yamazaki et al. |
| 7,112,541 B2 | 9/2006 | Xia et al. |
| 7,132,334 B2 | 11/2006 | Lin |
| 7,144,606 B2 | 12/2006 | Huang |
| 7,148,155 B1 | 12/2006 | Tarafdar et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,195,548 B1 | 3/2007 | Hardikar et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |
| 7,264,676 B2 | 9/2007 | Lai et al. |
| 7,265,061 B1 | 9/2007 | Cho et al. |
| 7,304,302 B1 | 12/2007 | Nunan et al. |

(56) References Cited

U.S. PATENT DOCUMENTS

| | | |
|---|---|---|
| 7,327,948 B1 | 2/2008 | Shrinivasan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,402,532 B2 | 7/2008 | Clevenger et al. |
| 7,481,882 B2 | 1/2009 | Won et al. |
| 7,482,265 B2 | 1/2009 | Chen et al. |
| 7,504,663 B2 | 3/2009 | Yamazaki et al. |
| 7,510,982 B1 | 3/2009 | Draeger et al. |
| 7,538,012 B2 | 5/2009 | Ohmi et al. |
| 7,611,757 B1 | 11/2009 | Bandyopadhyay et al. |
| 7,622,162 B1 | 11/2009 | Schravendijk et al. |
| 7,705,431 B1 | 4/2010 | Sanganeria et al. |
| 7,790,633 B1 | 9/2010 | Tarafdar et al. |
| 7,851,232 B2 | 12/2010 | van Schravendijk et al. |
| 7,858,533 B2 * | 12/2010 | Liu et al. ............... 438/778 |
| 7,906,174 B1 | 3/2011 | Wu et al. |
| 8,043,667 B1 | 10/2011 | Bandyopadhyay et al. |
| 8,062,983 B1 | 11/2011 | Draeger et al. |
| 8,063,983 B2 | 11/2011 | Kotake et al. |
| 8,137,465 B1 | 3/2012 | Shrinivasan et al. |
| 8,211,510 B1 | 7/2012 | Varadarajan et al. |
| 8,242,028 B1 | 8/2012 | van Schravendijk et al. |
| 8,454,750 B1 | 6/2013 | Shrinivasan et al. |
| 8,465,991 B2 | 6/2013 | Varadarajan et al. |
| 8,512,818 B1 | 8/2013 | Varadarajan et al. |
| 8,535,767 B1 | 9/2013 | Kimura |
| 8,629,068 B1 | 1/2014 | Shrinivasan et al. |
| 8,715,788 B1 | 5/2014 | Bandyopadhyay et al. |
| 8,889,233 B1 | 11/2014 | Kelman et al. |
| 8,980,769 B1 | 3/2015 | Haverkamp et al. |
| 9,050,623 B1 | 6/2015 | Varadarajan |
| 2001/0001501 A1 | 5/2001 | Lee et al. |
| 2001/0014512 A1 | 8/2001 | Lyons et al. |
| 2002/0001973 A1 | 1/2002 | Wu et al. |
| 2002/0015850 A1 | 2/2002 | Nakamura et al. |
| 2002/0016085 A1 | 2/2002 | Huang et al. |
| 2002/0034626 A1 | 3/2002 | Liu et al. |
| 2002/0052124 A1 | 5/2002 | Raaijmakers et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0148563 A1 | 10/2002 | Carlson et al. |
| 2002/0172766 A1 | 11/2002 | Laxman et al. |
| 2002/0187627 A1 | 12/2002 | Yuang |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1 | 8/2003 | Waldfried et al. |
| 2003/0199603 A1 | 10/2003 | Walker et al. |
| 2003/0203321 A1 | 10/2003 | Ma et al. |
| 2003/0227087 A1 | 12/2003 | Kakamu et al. |
| 2003/0228769 A1 | 12/2003 | Chen et al. |
| 2003/0228770 A1 | 12/2003 | Lee et al. |
| 2004/0002617 A1 | 1/2004 | Rantala et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1 | 4/2004 | Rice et al. |
| 2004/0069410 A1 | 4/2004 | Moghadam et al. |
| 2004/0072405 A1 | 4/2004 | Yao et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0115933 A1 | 6/2004 | Jung et al. |
| 2004/0152239 A1 | 8/2004 | Bao et al. |
| 2004/0166240 A1 | 8/2004 | Rhee et al. |
| 2004/0175501 A1 | 9/2004 | Lukas et al. |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0226621 A1 | 12/2004 | Suguro et al. |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1 | 2/2005 | Clark et al. |
| 2005/0056369 A1 | 3/2005 | Lai et al. |
| 2005/0064712 A1 | 3/2005 | Andreas |
| 2005/0064726 A1 | 3/2005 | Reid et al. |
| 2005/0079717 A1 | 4/2005 | Savas et al. |
| 2005/0095840 A1 | 5/2005 | Bhanap et al. |
| 2005/0101154 A1 | 5/2005 | Huang |
| 2005/0112282 A1 | 5/2005 | Gordon et al. |
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0233598 A1 | 10/2005 | Jung et al. |
| 2005/0255712 A1 | 11/2005 | Kato et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0024976 A1 | 2/2006 | Waldfried et al. |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0105106 A1 | 5/2006 | Balseanu et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0020940 A1 | 1/2007 | Ohmi et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0065578 A1 | 3/2007 | McDougall |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 * | 7/2007 | Chen et al. ............... 438/637 |
| 2007/0189961 A1 | 8/2007 | Iacopi et al. |
| 2007/0196011 A1 | 8/2007 | Cox et al. |
| 2007/0196972 A1 | 8/2007 | Shima |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 * | 10/2007 | Dimitrakopoulos et al. 257/754 |
| 2007/0254204 A1 | 11/2007 | Shin et al. |
| 2007/0275569 A1 | 11/2007 | Moghadam et al. |

(56) References Cited

U.S. PATENT DOCUMENTS

| | | | |
|---|---|---|---|
| 2007/0281497 | A1 | 12/2007 | Liu et al. |
| 2007/0287240 | A1 | 12/2007 | Chen et al. |
| 2008/0009141 | A1 | 1/2008 | Dubois et al. |
| 2008/0020591 | A1 | 1/2008 | Balseanu et al. |
| 2008/0026579 | A1* | 1/2008 | Lai et al. .................. 438/687 |
| 2008/0053615 | A1 | 3/2008 | Sago et al. |
| 2008/0132055 | A1 | 6/2008 | Nguyen et al. |
| 2008/0199977 | A1 | 8/2008 | Weigel et al. |
| 2008/0242118 | A1 | 10/2008 | Dimitrakopoulos et al. |
| 2008/0254643 | A1 | 10/2008 | Clevenger et al. |
| 2008/0286697 | A1 | 11/2008 | Verhaverbeke et al. |
| 2008/0305600 | A1 | 12/2008 | Liao et al. |
| 2008/0318437 | A1 | 12/2008 | Kim et al. |
| 2008/0318438 | A1 | 12/2008 | Nakamura et al. |
| 2009/0017640 | A1 | 1/2009 | Huh et al. |
| 2009/0039475 | A1 | 2/2009 | Shioya |
| 2009/0059406 | A1 | 3/2009 | Powers et al. |
| 2009/0207624 | A1 | 8/2009 | Ma et al. |
| 2009/0243001 | A1* | 10/2009 | Ramkumar et al. .......... 257/411 |
| 2009/0269507 | A1 | 10/2009 | Yu et al. |
| 2009/0278116 | A1 | 11/2009 | Yamate |
| 2010/0018460 | A1* | 1/2010 | Singh et al. .................. 118/620 |
| 2010/0216303 | A1 | 8/2010 | Ohkura |
| 2010/0261349 | A1 | 10/2010 | van Schravendijk et al. |
| 2010/0267231 | A1 | 10/2010 | van Schravendijk et al. |
| 2010/0317198 | A1* | 12/2010 | Antonelli et al. ............ 438/758 |
| 2011/0045610 | A1 | 2/2011 | van Schravendijk et al. |
| 2011/0111533 | A1 | 5/2011 | Varadaraj An et al. |
| 2011/0117678 | A1 | 5/2011 | Varadarajan et al. |
| 2011/0236593 | A1 | 9/2011 | Okino et al. |
| 2012/0061718 | A1 | 3/2012 | Yamazaki et al. |
| 2014/0004717 | A1 | 1/2014 | Chan et al. |
| 2014/0080324 | A1 | 3/2014 | Shrinivasan et al. |
| 2014/0094038 | A1 | 4/2014 | Haverkamp et al. |

FOREIGN PATENT DOCUMENTS

| | | |
|---|---|---|
| CN | 101005023 A | 7/2007 |
| CN | 102074500 | 5/2011 |
| JP | 62-229833 | 10/1987 |
| JP | 01-107519 | 4/1989 |
| JP | 05-031735 A | 2/1993 |
| JP | 05-138658 A | 6/1993 |
| JP | 09-306892 | 11/1997 |
| JP | 11214364 A | 8/1999 |
| JP | 2001-104776 A | 4/2001 |
| JP | 2006165573 | 6/2006 |
| JP | 2007-508691 | 4/2007 |
| JP | 2007-194582 A | 8/2007 |
| JP | 63-307740 | 12/2008 |
| JP | 2010-103151 | 6/2010 |
| KR | 2000-0043888 | 7/2000 |
| KR | 10-1201039 | 11/2012 |
| TW | 201130045 | 9/2011 |
| TW | 201237959 | 9/2012 |
| WO | 2006/104583 | 10/2006 |
| WO | 2006/127463 | 11/2006 |
| WO | 2007/043206 | 4/2007 |
| WO | 2008/156608 | 12/2008 |
| WO | 2012/087620 | 6/2012 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Jan, C.H., et al, *90NM Generation, 300mm Wafer Low k ILD/Cu Interconnect Technology*, 2003 IEEE Interconnect Technology Conference.

Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Tipton et al., "Method of Porogen Removal From Porous Low-K Films Using UV Radiation", Novellus Systems, Inc., U.S. Appl. No. 10/672,311, filed Sep. 26, 2003, pp. 1-27.

U.S. Office Action dated Sep. 7, 2004, from U.S. Appl. No. 10/672,311.

U.S. Office Action dated Dec. 28, 2004, from U.S. Appl. No. 10/672,311.

Peter Singer, "New Materials and Designs to Improve Transistor Performance", Apr. 1, 2004, Semiconductor International.

Ghani et al, "A 90nm High vol. Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

U.S. Office Action dated Mar. 2, 2005, from U.S. Appl. No. 10/860,340.

U.S. Final Office Action dated Jun. 13, 2005, from U.S. Appl. No. 10/860,340.

Varadarajan et al., "Tensile Dielectric Films Using UV Curing", U.S. Appl. No. 10/972,084, filed Oct. 22, 2004.

Draeger et al., "Creation of Porosity in Low-K Films by Photo-Disassociation of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Final Office Action dated Jul. 13, 2005, from U.S. Appl. No. 10/672,311.

U.S. Office Action dated Dec. 20, 2005, from U.S. Appl. No. 10/672,311.

U.S. Office Action dated Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action dated Jun. 28, 2006, from U.S. Appl. No. 10/825,888.

U.S. Office Action dated Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445.

Schravendijk, "UV Treatment of FSG Films to Improve Film Stability," Novellus Systems, Inc., U.S. Appl. No. 11/622,423, filed Jan. 11, 2007, pp. 1-31.

(56) References Cited

OTHER PUBLICATIONS

Schravendijk, et al., "UV Treatment of STI Films for Stress," Novellus Systems, Inc., U.S. Appl. No. 11/811,048, filed Jun. 7, 2007.
Arghavani et al., Strain Engineering in Non-Volatile Memories, *Reed Business Information*, 2007, six pages.
Notice of Allowance and Fee Due dated May 22, 2006, from U.S. Appl. No. 10/672,311.
Allowed Claims from U.S. Appl. No. 10/672,311.
Notice of Allowance and Fee Due dated Apr. 4, 2007, from U.S. Appl. No. 10/825,888.
Allowed Claims from U.S. Appl. No. 10/825,888.
Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.
Notice of Allowance and Fee Due dated Oct. 10, 2006, from U.S Appl. No. 10/800,377.
Allowed Claims from U.S. Appl. No. 10/800,377.
U.S. Office Action dated Nov. 28, 2007, from U.S. Appl. No. 10/807,680.
R.J. Lewis, Sr., Hawley's Condensed Chemical Dictionary, 12th Edition, Van Nostrad Reinhold Co., New York, 1993 (no month), excerpts pp. 916-918 & 1123-1124.
Notice of Allowance and Fee Due dated Dec. 20, 2005, from U.S. Appl. No. 10/860,340.
Allowed Claims from U.S. Appl. No. 10/860,340.
U.S. Office Action dated Dec. 12, 2007, from U.S. Appl. No. 11/146,456.
U.S. Office Action dated Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.
Van den Hoek, et al., "VLSI Fabrication Processes for Introducing Pores Into Dielectric Materials," Novellus Systems, Inc., U.S. Appl. No. 11/606,340, filed Nov. 28, 2006.
U.S. Office Action dated Jan. 10, 2008, from U.S. Appl. No. 11/622,423.
Bhadri Varadarajan et al., "Development of High Stress SiN Films for Use with Strained Silicon Technologies"; Proc. 68th Symp. On Semiconductors and IC Tech.; Kyoto 2005.
U.S. Office Action dated Apr. 3, 2008, from U.S. Appl. No. 10/982,654.
U.S. Office Action dated Sep. 19, 2008, from U.S. Appl. No. 11/824,049.
U.S. Final Office Action dated Jul. 10, 2008, from U.S. Appl. No. 10/807,680.
U.S. Final Office Action dated Jul. 25, 2008, from U.S. Appl. No. 11/146,456.
U.S. Final Office Action dated Jul. 9, 2008, from U.S. Appl. No. 10/982,654.
U.S. Office Action dated May 14, 2008, from U.S. Appl. No. 11/519,445.
U.S. Final Office Action dated May 2, 2008, from U.S. Appl. No. 11/115,576.
U.S. Office Action dated Oct. 17, 2008, from U.S. Appl. No. 11/115,576.
U.S. Office Action dated Jul. 23, 2008, from U.S. Appl. No. 11/622,423.
U.S. Appl. No. 11/590,661, Office Action dated Apr. 6, 2009.
U.S. Appl. No. 11/811,048, Office Action dated Mar. 19, 2009.

Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action dated Feb. 5, 2009.
U.S. Appl. No. 11/824,049, Office Action dated Mar. 19, 2009.
U.S. Appl. No. 11/824,049, Notice of Allowance dated Jun. 22, 2009.
U.S. Appl. No. 11/824,049, Allowed Claims.
U.S. Appl. No. 10/982,654, Office Action dated Dec. 4, 2008.
U.S. Appl. No. 11/519,445, Office Action dated Dec. 10, 2008.
U.S. Appl. No. 10/972,084, Office Action dated Dec. 30, 2008.
U.S. Appl. No. 11/115,576, Office Action dated Apr. 22, 2009.
Draeger et al., "Creation of Porosity in Low-K Films by Photo-Disassociation of Imbedded Nanoparticles," U.S. Appl. No. 12/369,384, filed Feb. 11, 2009.
U.S. Appl. No. 11/688,695, Office Action dated Jun. 11, 2009.
U.S. Appl. No. 11/696,102, Office Action dated Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Notice of Allowance dated Aug. 17, 2009.
U.S. Appl. No. 11/811,048, Allowed Claims.
U.S. Appl. No. 11/369,311, Office Action dated Aug. 20, 2009.
U.S. Appl. No. 11/608,056, Office Action dated Aug. 20, 2009.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$Nx: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action dated Oct. 28, 2008.
U.S. Appl. No. 11/975,473, Office Action dated Mar. 23, 2009.
Jiang et al., "Tensile dielectric films using UV curing", U.S. Appl. No. 11/899,683, filed Sep. 7, 2007.
U.S. Appl. No. 11/899,683, Office Action dated May 29, 2009.
U.S. Appl. No. 11/519,445, Office Action dated Aug. 26, 2009.
U.S. Appl. No. 11/622,409, Office Action dated Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action dated Jun. 1, 2009.
U.S. Appl. No. 11/115,576, Office Action dated Oct. 1, 2009.
U.S. Appl. No. 11/975,473, Office Action dated Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action dated Nov. 5, 2009.
U.S. Appl. No. 11/519,445, Office Action dated Nov. 4, 2009.
U.S. Appl. No. 10/972,084, Office Action dated Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, et al., "Progressive UV Cure," Novellus Systems, Inc., U.S. Appl. No. 12/210,060, filed Sep. 12, 2008.
U.S. Appl. No. 11/696,102, Final Office Action dated Dec. 22, 2009.
U.S. Appl. No. 11/369,311, Office Action dated Jan. 5, 2010.
U.S. Appl. No. 11/688,695, Final Office Action dated Dec. 31, 2009.
U.S. Appl. No. 11/590,661, Final Office Action dated Jan. 25, 2010.
U.S. Appl. No. 11/656,661, Office Action dated Jan. 22, 2010.
U.S. Appl. No. 11/731,581, Office Action dated Feb. 4, 2010.
U.S. Appl. No. 11/899,683, Office Action dated Feb. 8, 2010.
Wu, et al., "Methods for Fabricating Zeolite Nano-Crystal Based Low-K Dielectric Films Containing Si (CxHy)n Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action dated Mar. 9, 2010.

(56) References Cited

OTHER PUBLICATIONS

Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-k dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 10/975,028, Office Action dated Oct. 6, 2005.
U.S. Appl. No. 10/975,028, Office Action dated Mar. 24, 2006.
U.S. Appl. No. 10/975,028, Notice of Allowance dated May 8, 2006.
U.S. Appl. No. 11/811,048, Notice of Allowance dated Oct. 8, 2009.
U.S. Appl. No. 11/608,056, Office Action dated Mar. 23, 2010.
U.S. Appl. No. 11/975,473, Office Action dated Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/519,445, Notice of Allowance dated Apr. 21, 2010.
U.S. Appl. No. 11/561,834, Office Action dated May 21, 2010.
U.S. Appl. No. 12/840,192, "Sequential deposition / anneal film densification method", Tarafdar et al., filed Jul. 20, 2010.
U.S. Appl. No. 11/688,695, Office Action dated Jul. 23, 2010.
U.S. Appl. No. 11/590,661, Notice of Allowance dated Aug. 6, 2010.
U.S. Appl. No. 11/656,661, Final Office Action dated Aug. 24, 2010.
U.S. Appl. No. 12/172,089, Office Action dated Sep. 13, 2010.
Li, Shuang et al., "Organic-functionalized pure-silica-zeolite MFI low-k films", Chem. Mater. 2005, 17, Mar. 9, 2005, pp. 1851-1854.
U.S. Appl. No. 11/731,581, Final Office Action dated Sep. 2, 2010.
U.S. Appl. No. 10/972,084, Office Action dated Oct. 15, 2010.
U.S. Appl. No. 11/977,792, Office Action dated Oct. 25, 2010.
U.S. Appl. No. 11/975,473, Office Action dated Nov. 1, 2010.
U.S. Appl. No. 11/608,056, Notice of Allowance dated Nov. 2, 2010.
U.S. Appl. No. 12/566,514, Office Action dated Jan. 11, 2011.
U.S. Appl. No. 11/561,834, Final Office Action dated Dec. 3, 2010.
U.S. Appl. No. 11/696,102, Office Action dated Jan. 26, 2011.
U.S. Appl. No. 11/688,695, Office Action dated Feb. 1, 2011.
U.S. Appl. No. 11/146,456, Notice of Allowance dated Nov. 10, 2008.
U.S. Appl. No. 11/146,456, Supplemental Notice of Allowance dated Dec. 15, 2008.
U.S. Office Action dated Feb. 22, 2011, from U.S. Appl. No. 12/369,384.
U.S. Appl. No. 12/172,089, Office Action dated Jun. 14, 2011.
U.S. Appl. No. 11/369,311, Office Action dated Apr. 13, 2011.
U.S. Appl. No. 12/172,089, Final Office Action dated Apr. 14, 2011.
U.S. Appl. No. 10/972,084, Office Action dated May 2, 2011.
U.S. Appl. No. 11/656,661, Office Action dated May 19, 2011.
U.S. Appl. No. 11/731,581, Office Action dated Jun. 2, 2011.
U.S. Appl. No. 11/977,792, Office Action dated Jul. 6, 2011.
U.S. Appl. No. 11/897,838, Office Action dated Jul. 11, 2011.
U.S. Appl. No. 12/566,514, Notice of Allowance dated Jul. 13, 2011.
U.S. Appl. No. 12/566,514, Allowed Claims as of Jul. 13, 2011.
U.S. Appl. No. 11/696,102, Final Office Action dated Aug. 11, 2011.
U.S. Appl. No. 12/369,384, Notice of Allowance dated Aug. 19, 2011.
U.S. Appl. No. 12/369,384, Allowed Claims as of Aug. 19.
Korean Notification of Provisional Rejection dated Jul. 12, 2011 for Application No. 10-2010-0066153.
U.S. Appl. No. 11/369,311, Final Office Action dated Sep. 29, 2011.
U.S. Appl. No. 12/973,549, Office Action dated Oct. 11, 2011.
U.S. Appl. No. 11/977,792, Office Action dated Oct. 24, 2011.
U.S. Appl. No. 10/972,084, Office Action dated Oct. 27, 2011.
U.S. Appl. No. 11/656,661, Final Office Action dated Nov. 10, 2011.
U.S. Appl. No. 12/940,324, Office Action dated Dec. 13, 2011.
U.S. Appl. No. 11/731,581, Office Action dated Nov. 28, 2011.
U.S. Appl. No. 11/115,576, Notice of Allowance dated Nov. 14, 2011.
U.S. Appl. No. 12/210,060, Office Action dated Nov. 28, 2011.
U.S. Appl. No. 11/688,695, Office Action dated Dec. 14, 2011.
U.S. Appl. No. 12/840,192, Office Action dated Feb. 6, 2012.
U.S. Appl. No. 13/275,209, Office Action dated Mar. 12, 2012.
U.S. Appl. No. 11/369,311, Office Action dated Mar. 7, 2012.
U.S. Appl. No. 11/696,102, Notice of Allowance dated Feb. 24, 2012.
U.S. Appl. No. 11/696,102, Allowed Claims, Feb. 24, 2012.
U.S. Appl. No. 11/897,838, Notice of Allowance dated Mar. 2, 2012.
U.S. Appl. No. 11/897,838, Allowed Claims, Mar. 2, 2012.
Deshmukh, et al., "Remote Plasma Etching Reactors: Modeling and Experiment," J. Vac. Sci. Technol., B 11(2), Mar./Apr. 1993, pp. 206-215.
SG patent application No. 2010079747, Examination Report dated Apr. 25, 2012.
U.S. Appl. No. 10/972,084, Office Action dated May 1, 2012.
U.S. Appl. No. 12/726,263, Office Action dated May 31, 2012.
Varadarajan et al., "A Cascaded Cure Approach to Fabricate Highly Tensile Silicon Nitride Films," Novellus Systems, Inc., U.S. Appl. No. 13/487,051, filed Jun. 1, 2012.
U.S. Appl. No. 12/973,549, Office Action dated Jun. 7, 2012.
U.S. Appl. No. 12/840,192, Office Action dated Jul. 19, 2012.
U.S. Appl. No. 13/886,694, filed May 3, 2013, entitled "Multi-Station Sequential Curing of Dielectric Films."
U.S. Final Office Action dated Aug. 15, 2012 issued in U.S. Appl. No. 13/275,209.
U.S. Office Action dated Jul. 19, 2012 issued in U.S. Appl. No. 11/656,661.
U.S. Final Office Action dated Jan. 30, 2013 issued in U.S. Appl. No. 11/656,661.
U.S. Notice of Allowance dated Sep. 20, 2012 issued in U.S. Appl. No. 12/840,192.
U.S. Office Action dated Mar. 15, 2013 issued in U.S. Appl. No. 12/840,192.
U.S. Office Action dated Oct. 5, 2012 issued in U.S. Appl. No. 10/972,084.
U.S. Final Office Action dated May 22, 2013 issued in U.S. Appl. No. 10/972,084.
U.S. Final Office Action dated Jul. 31, 2012 issued in U.S. Appl. No. 11/369,311.
U.S. Final Office Action dated Jun. 21, 2012 issued in U.S. Appl. No. 11/688,695.
U.S. Notice of Allowance dated Oct. 4, 2012 issued in U.S. Appl. No. 11/688,695.
U.S. Notice of Allowance dated Feb. 14, 2013 issued in U.S. Appl. No. 11/688,695.
U.S. Office Action dated Aug. 28, 2012 issued in U.S. Appl. No. 11/731,581.
U.S. Final Office Action dated Sep. 10, 2012 issued in U.S. Appl. No. 12/726,263.
U.S. Office Action dated Mar. 6, 2013, issued in U.S. Appl. No. 12/726,263.
U.S. Office Action, dated Jan. 3, 2013, issued in U.S. Appl. No. 13/487,051.
U.S. Notice of Allowance, dated Apr. 22, 2013, issued in U.S. Appl. No. 13/487,051.
U.S. Final Office Action dated Oct. 3, 2012, issued in U.S. Appl. No. 12/210,060.
U.S. Office Action dated Jan. 3, 2013 issued in U.S. Appl. No. 12/973,549.
U.S. Notice of Allowance dated Feb. 22, 2013 issued in U.S. Appl. No. 12/973,549.
Chinese Office Action dated Jan. 14, 2013 issued in Appl. No. 201010539625.7.
Korean Notification of Provisional Rejection dated Mar. 26, 2012 issued in Appl. No. 10-2010-0066153.

(56) References Cited

OTHER PUBLICATIONS

Taiwan Office Action dated Mar. 27, 2013 issued in Application No. 099123184.
PCT International Search Report and Written Opinion dated Dec. 26, 2012, issued in WO Patent Application No. PCT/US2011/064246.
Bandyopadhyay et al., "Method to Improve Mechanical Strength of Low-K Dielectric Film Using Modulated UV Exposure," Novellus Systems, Inc., U.S. Appl. No. 13/275,209, filed Oct. 17, 2011.
U.S. Appl. No. 14/086,732 entitled Multi-Station Sequential Curing of Dielectric Films by Shrinivasan et al. filed Nov. 21, 2013.
Haverkamp et al., "Enhancing adhesion of cap layer films", U.S. Appl. No. 14/026,894, filed Sep. 13, 2013.
U.S. Office Action dated Jul. 25, 2013 in U.S. Appl. No. 13/275,209.
U.S. Notice of Allowance dated May 3, 2010 in U.S. Appl. No. 11/519,445.
U.S. Final Office Action dated Aug. 8, 2013 in U.S. Appl. No. 10/972,084.
U.S. Office Action dated Jun. 11, 2013 issued in U.S. Appl. No. 11/369,311.
U.S. Final Office Action dated Oct. 25, 2013 issued in U.S. Appl. No. 11/369,311.
U.S. Office Action dated Jul. 19, 2013 in U.S. Appl. No. 13/886,694.
U.S. Notice of Allowance dated Sep. 12, 2013 in U.S. Appl. No. 13/886,694.
U.S. Final Office Action dated Jun. 14, 2013 in U.S. Appl. No. 11/731,581.
U.S. Final Office Action, dated Aug. 7, 2013, issued in U.S. Appl. No. 12/726,263.
Chinese Second Office Action dated Sep. 10, 2013 issued in Appl. No. 201010539625.7.
PCT International Preliminary Report on Patentability and Written Opinion dated Jul. 4, 2013, issued in PCT/US2011/064246.
Korean Office Action dated Sep. 26, 2013, issued in KR 2013-7019282.
Taiwan Search Report dated Aug. 20, 2013 issued in TW 100147212.
US Office Action (Supplemental), dated Jan. 10, 2006, issued in U.S. Appl. No. 10/672,311.
U.S. Notice of Allowance dated Jan. 9, 2014 issued in U.S. Appl. No. 13/275,209.
U.S. Examiner's Answer to Appeal Brief (filed Nov. 20, 2013) Before the Patent Trial and Appeal Board on Mar. 13, 2014 issued in U.S. Appl. No. 10/972,084.
U.S. 2nd or Subsequent Examiner's Answer to Appeal Brief (filed Nov. 20, 2013) Before the Patent Trial and Appeal Board on Apr. 2, 2014 issued in U.S. Appl. No. 10/972,084.
U.S. Office Action dated Mar. 17, 2014 issued in U.S. Appl. No. 11/369,311.
U.S. Notice of Allowance dated Jul. 17, 2014 issued in U.S. Appl. No. 11/369,311.
U.S. Office Action dated Feb. 25, 2014 issued in U.S. Appl. No. 11/977,792.
U.S. Office Action dated Mar. 31, 2014 issued in U.S. Appl. No. 14/026,894.
U.S. Office Action dated Apr. 24, 2014 issued in U.S. Appl. No. 12/210,060.
Chinese Third Office Action dated May 23, 2014 issued in Appl. No. 201010539625.7.
Korean Second Office Action dated Dec. 5, 2013, issued in KR 2013-7019282.
U.S. Appl. No. 14/517,732, filed Oct. 17, 2014, entitled "Low-K Damage Repair and Pore Sealing Agents With Photosensitive End Groups."
Chinese Fourth Office Action dated Mar. 24, 2015 issued in Appl. No. 201010539625.7.
Chinese Fifth Office Action dated Oct. 19, 2015 issued in Appl. No. 201010539625.7.
Grill et al. (Nov. 15, 2003) "Structure of low dielectric constant to extreme low dielectric constant SiCOH films: Fourier transform infrared spectroscopy charaterization," *Journal of Applied Physics*, 94(10):6697-6707.
U.S. Office Action dated Jun. 18, 2015 issued in U.S. Appl. No. 14/086,732.
U.S. Final Office Action dated Nov. 20, 2015 issued in U.S. Appl. No. 14/086,732.
U.S. Notice of Allowance dated Oct. 8, 2014 issued in U.S. Appl. No. 11/977,792.
U.S. Notice of Allowance dated Feb. 9, 2015 issued in U.S. Appl. No. 11/977,792.
U.S. Final Office Action dated Dec. 5, 2014 issued in U.S. Appl. No. 14/026,894.
U.S. Final Office Action dated Nov. 17, 2014, issued in U.S. Appl. No. 12/210,060.
U.S. Notice of Allowance dated Feb. 5, 2015 issued in U.S. Appl. No. 12/210,060.
Daumont et al., (1992) "Ozone UV Spectroscopy I: Absorption Cross-Sections at Room Temperature," *Journal of Atmospheric Chemistry*, 15:145-155.
Ityaksov, D. et al., (2008) "Deep-UV absorption and Rayleigh scattering of carbon dioxide," *Chemical Physical Letters*, 462:31-34.
Malicet et al., (1995) "Ozone UV Spectroscopy. II. Absorption Cross-Sections and Temperature Dependence", *Journal of Atmospheric Chemistry*, 21:263-273.
van Dishoeck, et al., (Jun. 20, 2011) "Molecular photodissociation," *Modern Concepts in Laboratory Astrochemistry*, arXiv:1106.3917v1 [astro-ph.IM], 18 pp.
Venot, O. et al., (2013) "High-temperature measurements of VUV-absorption cross sections of CO2 and their application to exoplanets," *Astronomy & Astrophysics*, 551:A131.
Lambert et al., "Reactive Ultraviolet Thermal Processing of Low Dielectric Constant Materials," U.S. Appl. No. 14/546,990, filed Nov. 18, 2014.

\* cited by examiner

UV AND REDUCING TREATMENT FOR K RECOVERY AND SURFACE CLEAN IN SEMICONDUCTOR PROCESSING

CROSS-REFERENCE TO RELATED APPLICATION

This application claims priority to U.S. Provisional Patent Application No. 61/260,789 filed Nov. 12, 2009, titled UV AND REDUCING TREATMENT FOR K RECOVERY AND SURFACE CLEAN IN SEMICONDUCTOR PROCESSING. This provisional patent application is incorporated herein by reference in its entirety for all purposes.

BACKGROUND OF THE INVENTION

The invention relates to semiconductor processing, in particular to surface cleaning and repair of process-induced damage of low dielectric constant dielectric materials in, for example, damascene processing.

Low dielectric constant (low-k) insulating materials have been integrated into semiconductor devices in order to address reduced feature sizes and high performance requirements. These low-k dielectrics are mechanically weaker than previous generation dielectric materials. The inherently weak nature of the low-k dielectric material can pose significant challenges for downstream electronic-packaging processes and material compatibility.

Low-k materials are, by definition, those semiconductor-grade insulating materials that have a dielectric constant ("k") lower than that of $SiO_2$, i.e., 3.9. Various types of low-k materials can have dielectric constants ranging from about 3.8-3.6 (e.g., fluorosilicate glass (FSG)), to less than about 3.2 (e.g., (carbon doped oxide (CDO)), to as low as 2.2 (e.g., spin-on glass (SOG)) or even lower, and encompass low-k dielectrics referred to as "ultra low-k" (ULK) and "extreme ultra low-k" (ELK). In many CDO low-k implementations, such as are described herein as one aspect of the invention, suitable carbon-containing low-k materials have a dielectric constant of about 2.7 or lower. To further reduce the size of devices on integrated circuits, it has become necessary to use conductive materials having low resistivity and insulators having low dielectric constants to reduce the capacitive coupling between adjacent metal lines. Low-k materials are being integrated into the devices to improve device performance and allow for device scaling.

Low-k materials are less dense than standard insulating materials such as $SiO_2$. This low density introduces a host of process integration and material compatibility difficulties. Achieving a balance between maintaining a low-k film's integrity, integrating it properly, and performing the necessary stripping, cleaning, and conditioning is challenging. Patterning processes (etching, stripping, deposition, and cleaning) can also have a drastic impact on the integrity of carbon-containing low-k materials, in particular SiOC-based low-k materials.

The properties that give carbon-containing low-k dielectric materials their desirable low dielectric constants are the very same properties that are leading to significant integration challenges. Carbon-containing low-k materials achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of traditional oxides, yielding a lower dielectric constant film that is both mechanically and chemically weaker. Because of the mechanical weakness, carbon-containing low-k films are susceptible to kinetic plasma damage that can undesirably densify the film and thus increase the film's effective k value.

Furthermore, chemical plasmas used in semiconductor processing operations to which dielectrics are exposed can modify carbon-containing low-k films where bonds such as Si—$CH_3$ are readily broken. The susceptibility of carbon-containing low-k materials to plasma modification poses a serious integration challenge since plasma processes are routinely used to etch, clean, and deposit films in the manufacturing of a semiconductor device. In a typical Damascene process flow, prior to metal barrier deposition, process induced carbon-containing low-k dielectric damage can be incurred by a patterned low-k dielectric from (plasma) etch, dry resist strip, wet cleaning and dry cleaning. Carbon-containing low-k materials are also susceptible to the intercalation of plasma species, residues, solvents, moisture, and precursor molecules that can either adsorb into, outgas from, or chemically modify the film. Thereafter, a conductive material, typically a metal, for example copper, is deposited onto the patterned dielectric layer to fill vias and trenches formed in the dielectric layer. Then, excess metal is removed via chemical mechanical polishing (CMP), thereby forming a planar surface comprising regions of exposed copper and low-k dielectric onto which other layers, such as a dielectric barrier, are deposited. The CMP process typically damages the low-k dielectric, resulting in carbon loss and water absorption. This causes the k of the low-k dielectric to increase, thereby lowering the RC improvement that the low-k material can potentially provide.

Also, exposed metal, particularly copper, regions are subject to oxidation prior to the formation of a dielectric barrier or subsequent layers on the wafer surface. And, organic residues of anti-corrosion components of CMP slurry, for example benzotriazole (BTA), may remain on a wafer surface after a CMP process. The presence of copper oxide and organic residue causes problems with the adhesion of the dielectric barrier on the wafer surface. Therefore, various cleaning processes may be used to remove such oxide and residue (another form of process-induced damage). In one specific example, such a wafer may be exposed to a direct plasma in a plasma-enhanced chemical vapor deposition (PECVD) processing chamber for a period of time prior to introducing chemical vapors to the processing chamber. The use of a reducing plasma, such as an ammonia or hydrogen plasma, may reduce copper oxide and hydrocarbons on the surface, thereby cleaning the surface. However, depending upon processing conditions, such direct plasmas also may affect a low-k dielectric surrounding the copper because the low-k material is locally densified at the surface either by ion bombardment or because of bound carbon removal through chemical activity. Some of the k damage induced by operations such as CMP to the low-k material may be recovered by doing a short anneal prior to the above described pre-treatment and etch stop deposition, but the recovery is only marginal.

SUMMARY OF THE INVENTION

The present invention provides a method for treatment of carbon-containing low-k dielectric, for example, but not limited to carbon-doped oxide (CDO), and possibly including a metal feature, with a reducing agent and ultraviolet (UV) radiation, for the repair of process-induced damage. In another aspect, treatment with a reducing agent and ultraviolet (UV) radiation is effective to clean a processed wafer surface by removal (reduction) of metal oxide (e.g., copper oxide) and/or organic residue of CMP slurry from the planarized surface of a processed wafer. The methods of the invention are particularly applicable in the context of damascene processing to recover lost low-k property of a dielectric damaged during processing, either pre-metalization, post-planarization, or both, and/or provide effective post-planarization surface cleaning to improve adhesion of subsequently applied dielectric barrier and/or other layers.

In one embodiment, the invention involves exposing a patterned metal (e.g., copper) interconnect wafer (post-CMP and prior to etch stop deposition) to a sufficient flux of ultraviolet (UV) radiation and a reducing agent, such as $NH_3$, resulting in metal oxide (e.g., copper oxide) reduction and removal of adsorbed organic residue remaining after CMP with minimal impact on the dielectric constant of the exposed dielectric (which may be low-k, for example a carbon-containing, e.g., CDO, such as ULK; or other low-k of non-low-k dielectric). This pre-treatment in and by itself can also recover some of the damage imparted to a low-k dielectric at the substrate surface (e.g., k degradation due to absorbed water). There are several other possible approaches in accordance with the invention such as the use of a short anneal (e.g., 1 minute or less) involving exposure of the dielectric surface to a reducing agent at a temperature of about 400° C., followed by a short UV exposure in an inert atmosphere such as Helium. In another embodiment, the wafer is exposed to UV in a reducing atmosphere, such as $NH_3$, to clean the metal (e.g., copper) surface, followed by UV exposure in an inert atmosphere for k damage recovery. In either case, the measured recovery of dielectric constant is more than what an anneal can achieve on its own.

While reduction of copper oxide is a particularly useful and exemplified embodiment, in other embodiments this same approach can be applied to the reduction of nickel oxide, tungsten oxide, cobalt oxide, or other metal oxides prior to dielectric and/or metallic barrier deposition, contact formation, or similar deposition process.

This process is amenable to inclusion on a properly designed load lock or as a module for a PECVD semiconductor wafer processing system, such as a Vector Extreme configured PECVD system, available from Novellus Systems, Inc., San Jose, Calif., for example.

In another aspect, the invention relates to a method of forming a semiconductor device. The method includes receiving in a processing chamber a semiconductor device substrate comprising a carbon-containing low-k dielectric layer having formed therein a feature, the feature having sidewalls and a bottom; and exposing the feature to a reducing agent and UV radiation. The process induced low-k dielectric damage in the feature is repaired.

In another aspect, the invention relates to a method of forming a semiconductor device involving receiving in a processing chamber a semiconductor device substrate comprising a planarized surface having conductive features in a dielectric layer; and exposing the planarized surface to UV radiation and a reducing agent. Planarization-induced damage on the surface is repaired.

The invention may also be more generally applicable in other semiconductor processing contexts. For example, receiving in a processing chamber a semiconductor device substrate, and exposing the semiconductor device substrate to UV radiation and a reducing agent such that processing-induced damage to the semiconductor device substrate is repaired.

These and other features and advantages of the present invention will be described in more detail below with reference to the associated drawings.

DETAILED DESCRIPTION OF EMBODIMENTS

Figure 1:
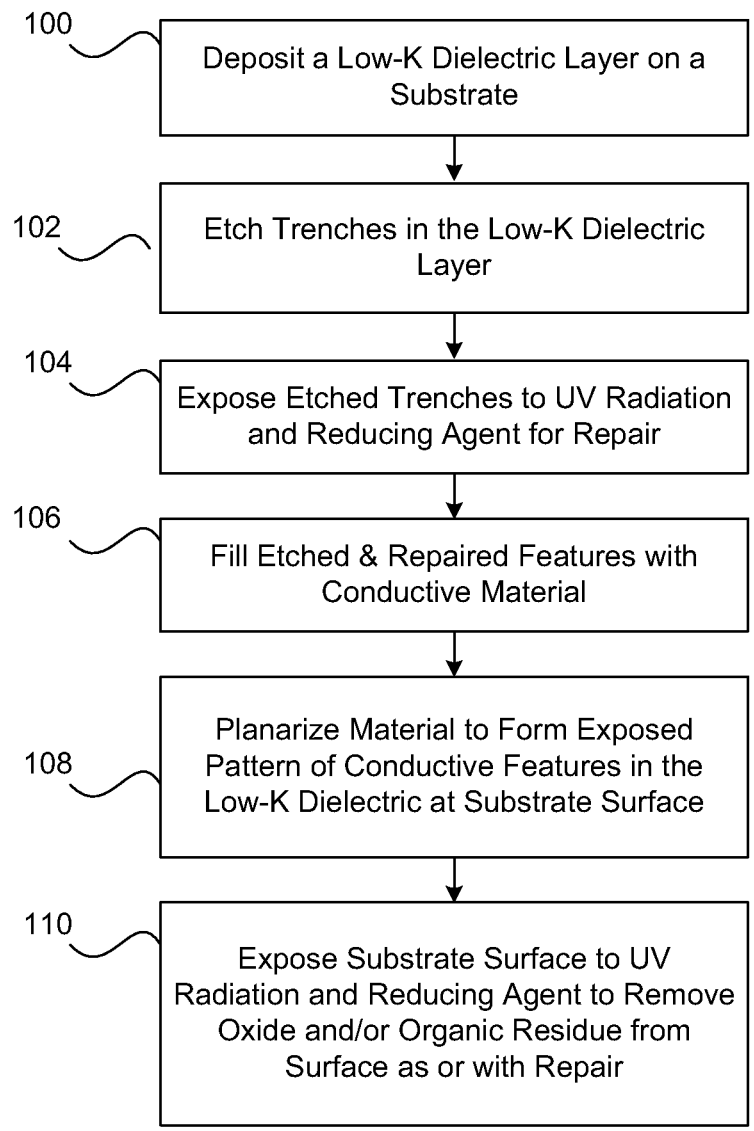
FIG. 1 is a process flow chart depicting a method in accordance with an embodiment of the invention.

Embodiments of the present invention are described herein primarily in the context of a treatment for carbon-containing low-k dielectric repair in damascene processing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

As noted above, the present invention provides a method of semiconductor device fabrication that involves exposure to a reducing agent and UV radiation. Treatments in accordance with the invention are effective for the repair of process-induced damage to the dielectric, for example, broken Si—$CH_3$ bonds in carbon-containing low-k dielectric (e.g., CDO) resulting from plasma trench etching, or oxidized metallization or organic residue resulting from CMP. Applicable carbon-containing dielectrics typically have SiO-based backbones doped with carbon, in particular CDO (for example, those formed from octamethyl cyclotetrasiloxane (OMCTS), tetramethylcyclotetrasiloxane (TMCTS), dimethyldimethoxysilane (DMDMOS), and diethoxymethylsilane (DEMS) and other known CDO precursors), but may also include hybrid polymers incorporating both C, Si and O in the backbone. The invention is applicable, at least in its post-planarization damage repair (e.g., surface cleaning) aspect to semiconductor substrates having non-carbon-containing low-k dielectrics, or non-low-k dielectrics at all, since the metal oxide reduction and organic CMP residue removal aspects are independent from the low-k dielectric repair and k-recovery aspect of the invention. The inventive methods are particularly applicable in the context of damascene processing.

In one aspect, the invention relates to a method of forming a semiconductor device by exposing a feature formed in a carbon-containing low-k dielectric layer to a reducing agent and UV radiation, either simultaneously or successively, to repair process induced low-k dielectric damage (e.g., dangling bonds or highly strained bonds, e.g., Si—O—Si or Si—CH$_2$—Si, caused by removal of organic (generally —CH$_3$) groups) to the low-k material of the feature sidewalls and bottom caused by plasma etch, dry resist strip, wet cleaning and dry cleaning, for example, involved in the feature formation process. The repaired feature can then be filled with a conductive material, particularly a metal diffusion barrier, followed by copper (or other suitable interconnect metal). The top surface of the semiconductor device can then be planarized, generally by chemical mechanical polishing (CMP). As noted above, post-planarization repair of planarization-induced dielectric damage in addition to or independent from pre-metallization dielectric repair are aspects of the invention.

FIG. 1 is a process flow chart depicting operations that may be performed in various methods in accordance with embodiments of the present invention. The invention is advantageously applied in a damascene processing context, although its application is not so limited. It should be understood that, in at least some aspects, the present invention requires only the UV radiation and reducing agent exposure of an applicable semiconductor device substrate such as described in operations 104 and/or 110 of the embodiment illustrated in FIG. 1. Other aspects of the invention may include additional processing operations, such as damascene processing operations described herein. But the invention is not limited to the performance of these additional processing operations in all its aspects. A generalized version of a dual damascene technique is described below with reference to FIGS. 2A through 2D, which depict a partially formed semiconductor device during various stages of this process. The invention may also be used in conjunction with other semiconductor processing techniques.

Referring now to FIG. 1, in operations that are not necessarily part of the present invention, but place an embodiment of the invention in context in an advantageous application, a carbon-containing low-k dielectric layer is deposited on a substrate at 100. Patterns of conductive features are formed in the dielectric layer, generally by plasma etching, at 102. Plasma etching generally results in damage to the pattern edges, generally trench sidewalls and bottoms, as described above. Other process operations, such as dry resist strip, wet cleaning and dry cleaning, can also cause or contribute to low-k dielectric damage. The conductive features are typically, though not necessarily, metal lines and vias. In one example, they are the interconnects of a metallization layer that is formed from copper. As is known to those of skill in the art, various techniques may be employed to form such layers.

The formed features (e.g., etched trenches) are then exposed to a reducing agent and ultraviolet (UV) radiation at 104. While the invention is not limited to any particular theory of operation, it is believed that the UV exposure of the damaged dielectric surface according to this aspect of the invention cross-links the surface Si groups to fill gaps from the departed methyl (—CH$_3$) groups. In addition, the UV energy may photo-excite the reducing agent to produce hydrogen or hydrogen-like (e.g., Deuterium) radicals which in turn volatize and remove or react away certain dangling bonds or non-structure forming carbon components which otherwise increase the polarizability of the matrix thus increasing the dielectric constant. In some embodiments, this reducing agent-mediated aspect of the low-k dielectric repair may involve exposure of the dielectric to a silylating agent, such as hexamethyldisilazane (HMDS) prior to or during the UV exposure, as described further below.

The reducing agent is typically a reducing gas, and may be photoactive either alone or in combination with other chemical species present in the processing chamber. Suitable examples of reducing agents include NH$_3$, or NH$_3$-like compounds, wherein the H is replaced by deuterium (e.g., NH$_2$D, NHD$_2$, ND$_3$), H$_2$; hydrazine (N$_2$H$_4$), or other photoreactive gases that can produce a H-radical such as tetramethylsilane (4MS) or trimethylsilane (3MS), amines (e.g., methyl-, dimethyl- or trimethyl-amine, or ethylamine), alkenes such as ethylene or propylene, or alkynes such as acetylene, or combinations of these with one another and/or inert gases such as He, N$_2$ or Ar. In specific examples, the reducing gas may be NH$_3$ or H$_2$. A specific example is NH$_3$.

According to various embodiments of the invention, the feature may be exposed to UV radiation in the presence of the reducing agent. In other embodiments, the feature may be exposed to UV radiation following exposure to the reducing agent, for example an initial anneal or soak of the feature with a reducing gas (e.g., NH$_3$), for example at a temperature below the targeted thermal budget, for example about 400° C., for about 30 seconds, followed by UV exposure in an inert gas (e.g., He), for example for about 30 seconds. In still other embodiments, an initial exposure to UV radiation in the presence of the reducing agent can be followed by a further exposure to UV radiation without the reducing agent, for example in an inert gas (e.g., He); or the reverse operations (i.e., exposure to UV radiation without the reducing agent, for example in an inert gas (e.g., He) followed by a further exposure to UV radiation in the presence of the reducing agent.

In another embodiment, damaged dielectric can be exposed to a silylating agent, such as HMDS, for example at a temperature of about 400° C. (anneal), followed by or during exposure to UV radiation, either in the presence of a reducing agent, such as NH$_3$, or an inert gas like He, Ar or N$_2$ where, for example, the substrate has previously been exposed to a reducing agent.

Following the treatment, a barrier layer may be deposited on the low-k dielectric layer, prior to subsequent processing of the semiconductor device.

Suitable reducing agent partial pressures are between about 1 and 700 Torr, for example 50-600 Torr. A typical reducing agent flow rate is about 15 slm. Exposure times of less than a minute, for example 30 or 25 seconds, are generally suitable. At very lower partial pressures, longer exposure times will generally be required.

The UV radiation may be obtained from any suitable UV source. The choices of UV wavelength(s), total exposure time and intensity, etc., depend on a number of factors, including the thickness of the dielectric film and the composition of the dielectric film. Suitable UV treatment parameters are in the power intensity range of about 1 mw-20 W/cm$^2$, preferably about 500 mW-5 W/cm$^2$; at a wavelength of about 150-500 nm, preferably about 200-400 nm; for up to about 1 minute, for example about 15, 30 or 45 seconds; at a wafer temperature of between room temperature up to about 450° C., preferably about 200-400° C. A typical UV exposure in accordance with this aspect of the invention has a power density of about 1-3 W/cm$^2$ at a wafer temperature of about 400° C. for about 30 seconds. The UV source can be a single wavelength excimer lamp or broad spectrum source with arc or microwave excitations. The process pressure can range from about 1 mTorr to 760 Torr, preferably from about 5 Torr to 700 Torr.

In one particular implementation on a SOLA UV thermal processing system, available from Novellus Systems, Inc., UV intensity can be anywhere between 10-100%. Lower intensity generally requires longer exposure times, particularly for cleaning. Temperature is set below target thermal budget (e.g., 350- 400° C.). Pressure can be as noted above. The UV wavelength used can be a broad band source using H+ bulbs with wavelength lower than 230 nm since $NH_3$ absorbs in this region. Other sources that produce such short wavelengths such as 172 nm excimers can also be used.

The process parameters for the UV treatment, including intensity, wavelength, temperature, pressure, time and gas flow, may be independently controlled and varied, and any or all of the process conditions may be varied from station to station where the invention is implemented in a multi-station processing apparatus. In particular, there may be independent control of temperature, reducing agent and UV irradiation. For example, the wafer may be brought to a temperature T for a time t, exposed to a reducing agent for a time t1, exposed to UV radiation and a reducing agent for time t2, exposed to UV radiation only for a time t3, and then moved to another station in a multi-station processing apparatus where any of the conditions including temperature, UV radiation intensity, pressure, wavelength, flow, and time may be independently changed within the described parameters.

The apparatus employed to implement the invention can have one or more UV sources. In some embodiments described herein, the apparatus will have a single UV source. Suitable apparatus are described in more detail below.

Following this UV treatment, in operations that are not necessarily part of the present invention but are provided for context for one embodiment as noted above, the trenches may then be filled at 106 with a conductive material, typically copper (Cu), although other metals may also be used. When filling the features, excess material will have to be removed from the top (exposed surface) of the dielectric layer. The excess material may be removed by a planarization process to form an exposed pattern of conductive features in the dielectric at 108. As discussed above, one widely-used planarization process is chemical mechanical polishing (CMP).

CMP slurry oxidizes the surface of the conductive material during planarization. It is beneficial to remove oxides from the conductive material after the planarization process. As discussed above, slurry from CMP can chemically remove carbon groups from the dielectric as well. In addition, organic residues of anti-corrosion components of CMP slurry, for example benzotriazole (BTA), may remain on a wafer surface after a CMP process. The presence of copper oxide and organic residue can interfere with the adhesion of subsequently applied layers, such as a dielectric barrier, on the wafer surface.

According to a further aspect of the invention, to repair the dielectric and remove the metal oxide and/or CMP slurry organic residue, the dielectric surface can be exposed to a further reducing agent and UV radiation treatment at 110. The treatment may be conducted under the same conditions as described above with reference to the post-trench etch treatment. The UV and reducing agent exposure of the present invention is also effective for removing metal oxide and CMP organic residue. While the invention is not limited to any particular theory of operation, it is believed that the UV exposure of the planarized surface according to this aspect of the invention cross-links the surface Si groups to fill gaps in the low-k dielectric from departed methyl (—$CH_3$) groups. In addition, the UV energy may photo-excite the reducing agent to produce hydrogen (or hydrogen-like) radicals which in turn volatize and remove or react away certain dangling bonds or non-structure forming carbon components which otherwise increase the polarizability of the matrix thus increasing the dielectric constant, and also volatize and remove or react away CMP organic residue. In addition, hydrogen (or hydrogen-like) radicals produced which can in turn drive the reduction of copper oxide to pure copper.

Following the damascene processing repair in accordance with the present invention, a diffusion barrier film, such as a copper diffusion barrier film, may be deposited on the planarized surface of the partially-formed semiconductor device. This layer may serve other purposes aside from that of a diffusion barrier. For example, the diffusion barrier film may also act as an etch stop layer.

According to various implementations of the present invention, a reducing agent and UV exposure treatment, as described above, may be conducted at either or both the pre-metallization (e.g., trench fill) and post-planarization stages of a semiconductor processing operation. The operation may include either or both processing operations. In embodiments where the reducing agent and UV exposure treatment is not applied at both stages of a semiconductor processing operation that includes both pre-metallization and post-planarization processing, other processing techniques may be combined with the reducing agent and UV exposure treatment at one stage or the other. For example, a UV exposure without reducing agent exposure may be used at one stage or the other.

Further, other processing operations may be combined with the reducing agent and UV exposure treatment at a given processing stage. For example, one embodiment of the invention involves a two-step post-CMP stage process involving dielectric repair for k recovery with UV cure in an inert (e.g., He) atmosphere, followed by UV cure with a reducing agent (e.g., $NH_3$) for surface cleaning; or the steps may be reversed. According to these embodiments, a short anneal (e.g., 30 seconds at 400° C.) before or after UV cure in $NH_3$ enables both surface cleaning and k recovery in a single treatment.

Referring now to FIGS. 2A-2D, a typical dual damascene process incorporating processing-induced damage repair processes of the present invention is illustrated. As noted above, it should be understood that an embodiment of the invention in context in an advantageous application is depicted. In at least some aspects, the present invention requires only the UV radiation and reducing agent exposure of the semiconductor device substrate, as described above. Other aspects of the invention may include additional processing operations, such as damascene processing operations described herein. But the invention is not limited to the performance of these additional processing operations in all its aspects.

Figure 2A:
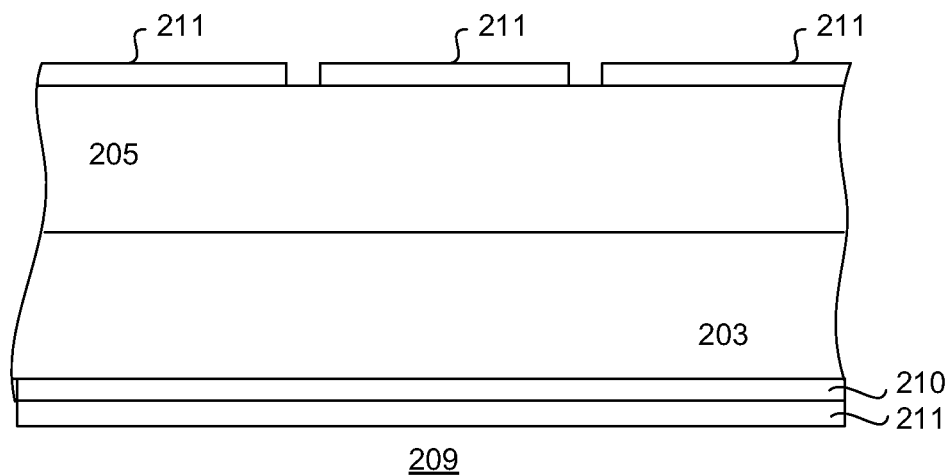
FIGS. 2A-2D are cross-sectional diagrams illustrating the formation of a semiconductor device by a dual damascene process in accordance with an embodiment of the invention.

Referring to FIG. 2A, first 203 and second 205 layers of dielectric are deposited in succession, possibly separated by deposition of an etch stop layer, such as a silicon nitride layer. As is well known in the art, according to alternative damascene processing techniques a single thicker dielectric layer can be used instead of discrete first and second layers.

Figure 2B:
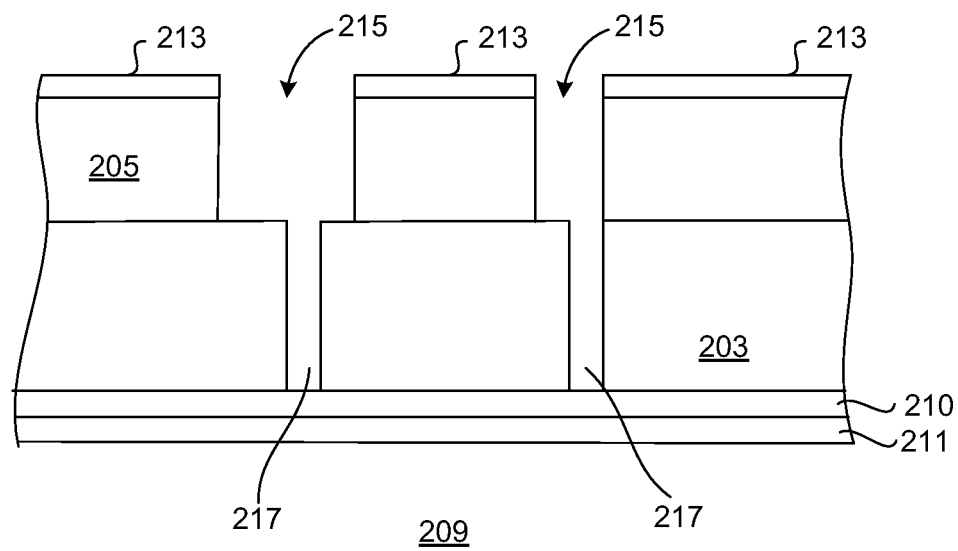
Figure 2C:
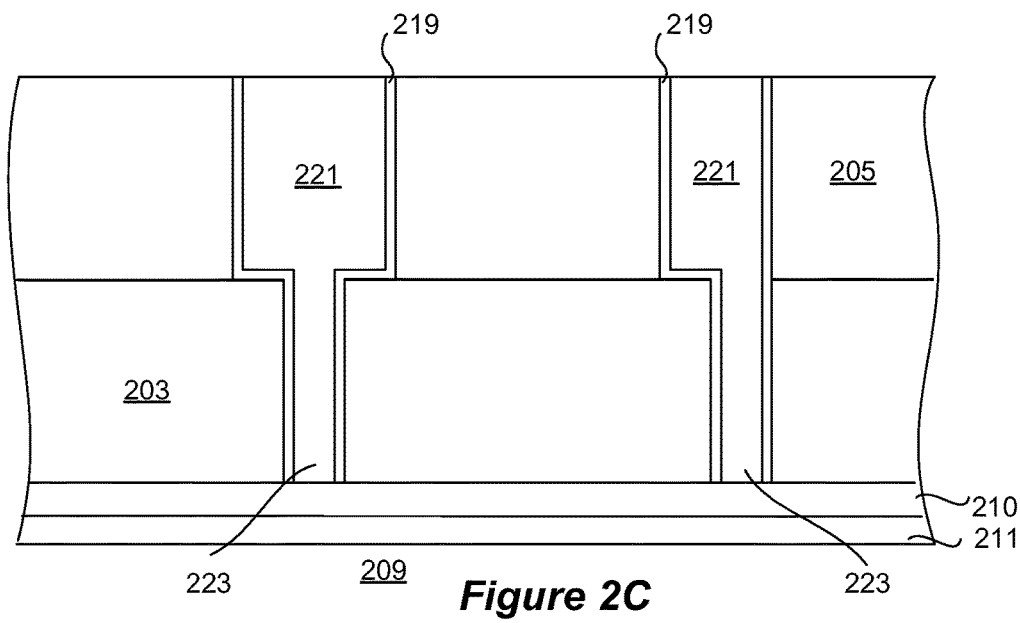
Figure 2D:
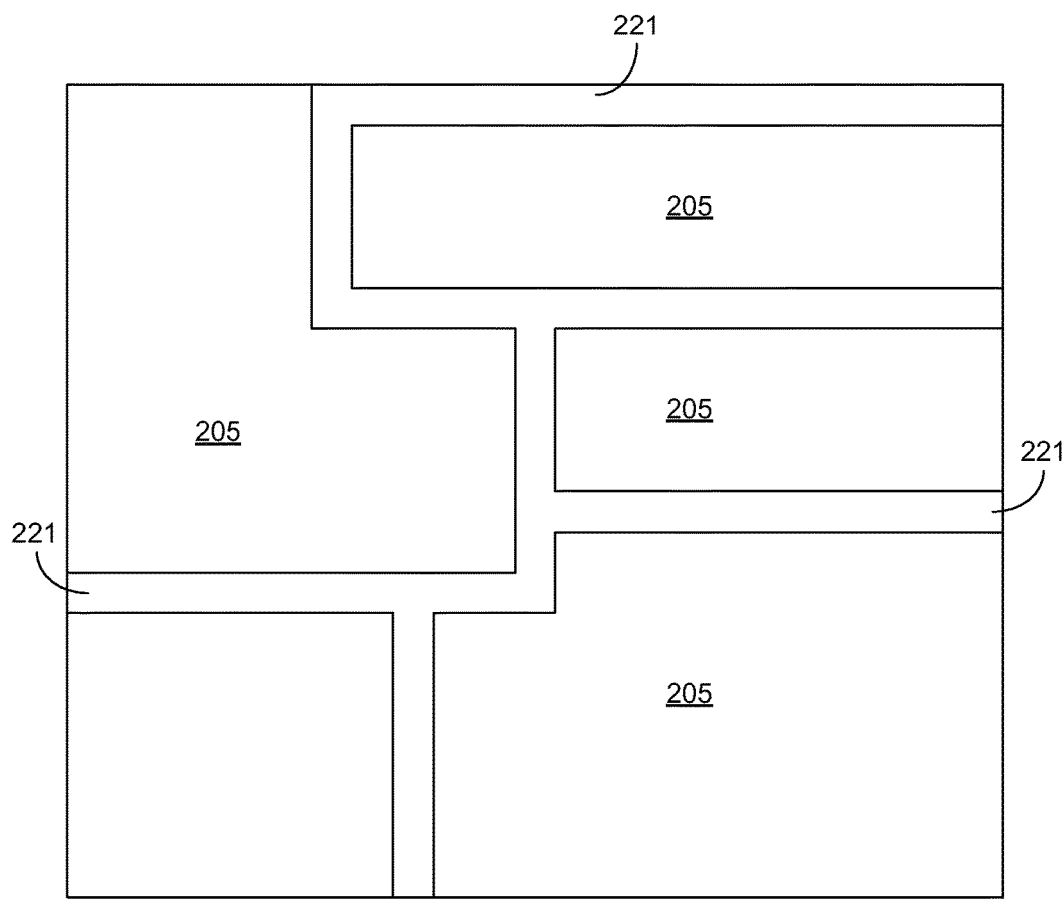

After deposition of the second dielectric layer 205, a via mask 211 is formed having openings where vias will be subsequently etched. Next, the vias are partially etched down through the level of the second dielectric 205. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact an etch stop layer 210 above a metal layer 211 on the underlying substrate 209.

It should be noted that the foregoing description is just an example of one dual damascene process with which the present invention may be implemented. One type of via-first dual damascene process has been described. In other embodiments, a via-first process may involve complete etching of the vias prior to etching of the line trenches. Or, a trench-first process, in which the etching of the line trenches precedes the via etching, may be used. These various damascene processing techniques, and other variations thereon, are well known in the art and represent alternative implementation contexts for embodiments of the present invention. The invention is also applicable is single damascene processing, more conventional metal deposition and etch, contact cleaning, and essentially any semiconductor processing context where carbon-containing low-k dielectrics are used (for the low-k repair aspect of the invention) and/or, for at least the post-planarization aspect of the invention, any semiconductor context in which metal oxide reduction or removal of organic CMP residue (surface cleaning) is required. In the case of contact cleaning, it should be understood that the metal oxide reducing aspect of the invention has two variants in a contact cleaning process, either or both of which may be performed in accordance with the present invention: Cleaning of the etched contact via prior to metal deposition and cleaning the filled metal contact after chemical mechanical polishing (CMP). In the first instance, the UV and reducing agent treatment reduces the oxide created in a silicide such as NiSi. In the second instance, the treatment reduces metal oxide grown on top of the metal contact, generally on metals such as W or Cu.

Further in this regard, the term "trench" in the context of damascene processing is commonly understood to describe a feature formed in dielectric and subsequently filled to form a conductive line in a dielectric layer. In a more general semiconductor processing context, the term is also understood to describe a feature formed in dielectric and subsequently filled to form an element of a semiconductor device (e.g., via, line, STI, etc.), and may include a damascene trench or a combined damascene structure. Unless it is otherwise clear from the context, when used herein, the term should be understood to have its broader meaning.

After trench etching, the photoresist is removed in another plasma process, followed by a wet or dry clean and then damage on the low-k dielectric surface is repaired, as discussed above.

Thereafter a thin layer of conductive barrier layer material 219 is formed on the exposed surfaces (including sidewalls) of dielectric layers 203 and 205. Conductive barrier layer material 219 may be formed, for example, of tantalum or tantalum nitride. A CVD or PVD operation is typically employed to deposit conductive barrier layer material 219. Prior to the deposition of the barrier material, a plasma process is typically used to clean the bottoms of the trenches to remove oxidation and contaminants from the exposed copper surface on the underlying layer. As is known to those skilled in the art, this barrier "preclean" plasma process can be simply an inert plasma or a reactive plasma of a gas such as hydrogen. The preclean plasma process can also damage a low-k dielectric film. A reducing agent and UV treatment as described above to repair the damaged low-k film may employed prior to the PVD operation- for Ta or TaN.

On top of the barrier layer, a conductive metal (typically copper) is deposited in the trench and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, electroless plating, etc. Note that the bulk deposition of copper not only fills line paths 215 but, to ensure complete filling, also covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. (See the cross-sectional view of FIG. 2C and the simplified top view of FIG. 2D.)

Planarization may be accomplished by various techniques. Typically, the process involves some amount of CMP. It may also involve a combination of electropolishing, to remove most of the excess bulk copper, followed by CMP to remove the remaining copper down to the level of the top surface of dielectric layer 205. As discussed above, slurry from CMP can chemically remove carbon groups, and the in-situ plasma based processes typically used to remove the oxides from the conductive lines after the planarization process can also remove carbon groups leaving silicon dangling bonds on the surface of low-k dielectric films. Each of these types of damage also results in significant water absorption, resulting in an increase in dielectric k.

As described previously, another aspect of the invention relates to post-planarization (e.g., CMP) damage repair arising in damascene processing. According to this aspect, following planarization by CMP, Si—OH (silanol) bonds (formed by removal of organic (generally —$CH_3$) groups by CMP slurry and processing and reaction of water in the slurry with resulting dangling Si— bonds), or other carbon-containing low-k dielectric film damage (e.g., highly strained bonds), or metal oxidation or CMP slurry organic residue contamination are repaired by exposing the surface to a reducing agent and UV radiation, as described above.

Apparatus

The present invention can be implemented in many different types of apparatus. In some embodiments, the apparatus will include one or more chambers (sometimes referred to as process modules) that house one or more wafers and are suitable for wafer processing. At least one chamber will include a UV source. A single chamber may have one or more stations and may be employed for one, some or all operations of the invention. Each chamber may house one or more wafers (substrates) for processing. The one or more chambers maintain the wafer in a defined position or positions (with or without motion within that position, e.g., rotation, vibration, or other agitation) during procedures of the invention. For certain operations in which the wafer temperature is to be controlled, the apparatus may include a controlled temperature wafer support, which may be heated, cooled, or both. The wafer support may also be controllable to provide the defined wafer positions within a process module. The wafer support may rotate, vibrate, or otherwise agitate the wafer relative to the UV source.

Figure 3:
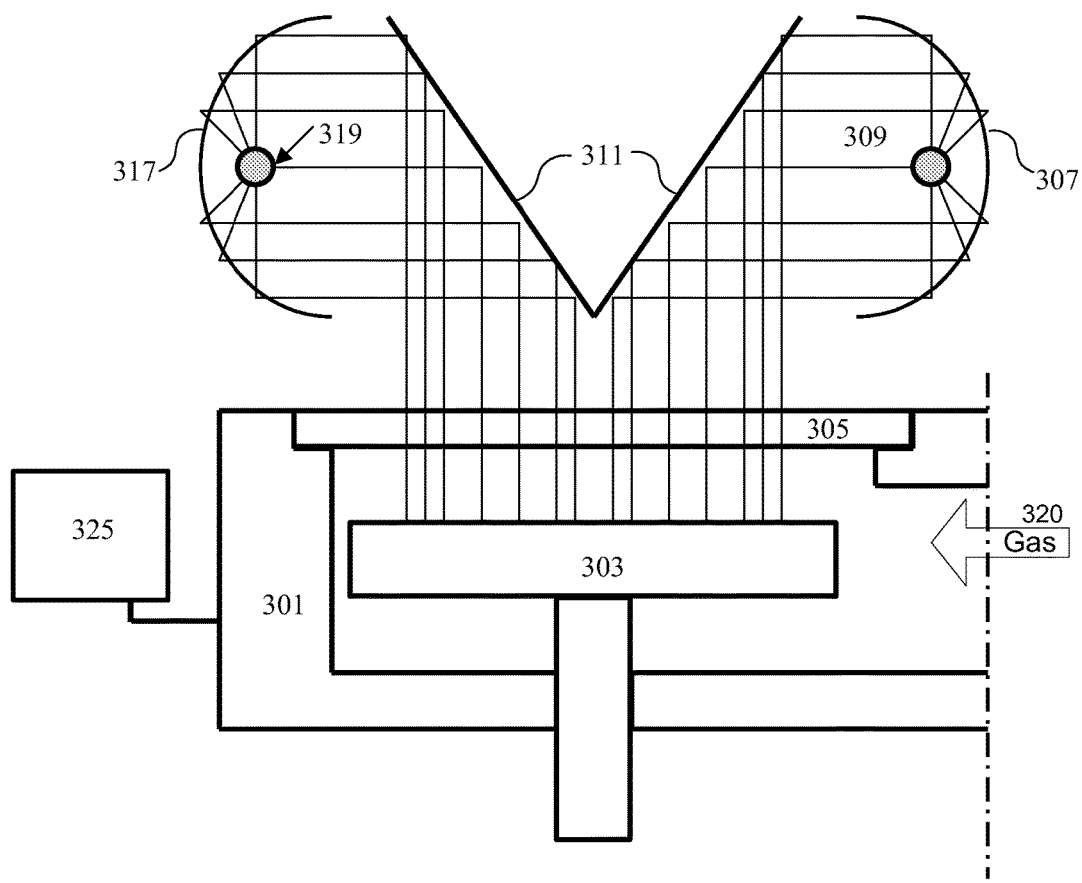
FIG. 3 is a schematic diagram of an example chamber suitable for implementing the present invention.

FIG. 3 depicts the arrangement of a UV light source suitable for implementation of the present invention. In this embodiment, a cold mirror reflector seeks to diminish the incidence of IR radiation on the wafer, while permitting UV radiation to be available for processing. For clarity, this figure depicts only one of the possible multiple processing stations available in an apparatus of this invention. Also, this figure omits depiction of the wafer for purposes of clarity, and shows a flood-type reflector. It will be apparent to those skilled in this art that the principles depicted in FIG. 3 may also be applied to a focused reflector.

Referring to FIG. 3, pedestal 303 is embedded into one station of a processing chamber 301. Window 305 is located appropriately above pedestal 303 to permit radiation of the wafer (not shown here) with UV output of the desired wavelengths from UV lamps 309 and 319. Suitable lamps for the UV light source may include, but are not limited to, mercury vapor or xenon lamps. Other suitable light sources include deuterium lamps, excimer lamps or lasers (e.g., excimer lasers and tunable variations of various lasers). Both lamps 309 and 319 are equipped with reflectors 307 and 317 which render their output into flood illumination. Reflectors 307 and 317 may themselves be made from "cold minor" materials, i.e., they may also be designed to transmit IR and reflect UV radiation.

Radiation emanating directly from lamps 309 and 319 as well as that reflected from reflectors 307 and 317 is further incident upon a set of reflectors 311. These reflectors are also cold mirrors designed to reflect only those UV wavelengths that are desired for the purposes of curing the film on the wafer. All other radiation including visible and most particularly the IR is transmitted by this set of cold minors. Therefore the wafer is radiated only by those wavelengths that cause the desired effect on the film. It will be apparent to those skilled in this art that the specific angle, distance, and orientation of the cold minor reflectors 311 with respect to the lamps 309 and 319 may be optimized to maximize the UV intensity incident on the wafer and to optimize the uniformity of its illumination.

The chamber 301 is capable of holding a vacuum and/or containing gases at pressures above atmospheric pressure. For simplicity, only one station of one chamber 301 is shown. It is noted that in some embodiments, chamber 301 is one chamber in a multi-chambered apparatus, although chamber 301 could alternatively be part of a stand-alone single chambered apparatus. In either case, the chamber(s) may have one or more than one station. In some embodiments of the present invention, the UV process modules have one station. Suitable apparatus for implementation of the invention may include configurations as described herein of INOVA, Sequel, Vector and SOLA systems from Novellus Systems, Inc. of San Jose, Calif., and Endura, Centura, Producer and Nanocure systems from Applied Materials of Santa Clara, Calif. In a particular example, the invention may be implemented on a Vector Extreme tool from Novellus Systems, Inc. of San Jose, Calif.

Note that the UV light source configuration of FIG. 3 is only an example of a suitable configuration. In general, it is preferable that the lamps are arranged to provide uniform UV radiation to the wafer. For example, other suitable lamp arrangements can include arrays of circular lamps concentrically or otherwise arranged, or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp vs. xenon lamp vs. deuterium lamp vs. excimer laser, etc.) as well as the use of filters that tailor the spectral distribution. In addition, the spectral distributions of some lamps can be tuned by doping the gas mixture in the lamp with particular dopants such as iron, gallium, etc.

The apparatus also includes a source of a reducing gas 320, such as $NH_3$ or $H_2$, or others as noted above.

In certain embodiments, a system controller 325 is employed to control process conditions during the UV treatment with reducing agent processes in accordance with the present invention. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, supply of gases (e.g., reducing agent gases), chamber pressure, chamber temperature, wafer temperature, UV wavelength, intensity and exposure time, and other parameters of a particular process. Other computer programs stored on memory devices associated with the controller may be employed in some embodiments.

Typically there will be a user interface associated with controller 625. The user interface may include a display screen, graphical software displays of the apparatus and/or process conditions, and user input devices such as pointing devices, keyboards, touch screens, microphones, etc.

The computer program code for controlling the processes can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive processes. Examples of programs or sections of programs for this purpose include substrate positioning code, reducing gas control code, pressure control code, heater control code, and UV radiation control code. In one embodiment, the controller includes instructions for performing processes of the invention according to methods described above.

It should be understood that the apparatus depicted in FIG. 3 is only an example of a suitable UV process module and that other designs may be used. The semiconductor device should be transferred from the UV module to the barrier layer deposition module without an air break. This may be accomplished on multiple of single tools.

EXAMPLES

The following provides examples of specific implementations of the present invention and performance data in order to give a better understanding of the invention. The invention is, however, in no way limited to these specific implementations.

Post-CMP Processing

In one embodiment of the invention, $NH_3$ was used as the reducing agent. $NH_3$ absorbs in the UV range, and can potentially create H radicals which can reduce metal oxide. Both the H radicals and exposure to UV radiation can potentially remove the residual CMP organic residue (C removal). In this example, very high curing pressures (about 600T) were used in order to increase generation of H radicals, but lower pressures can also be potentially used, depending on the amount of metal oxide that needs to be removed.

Figure 4:
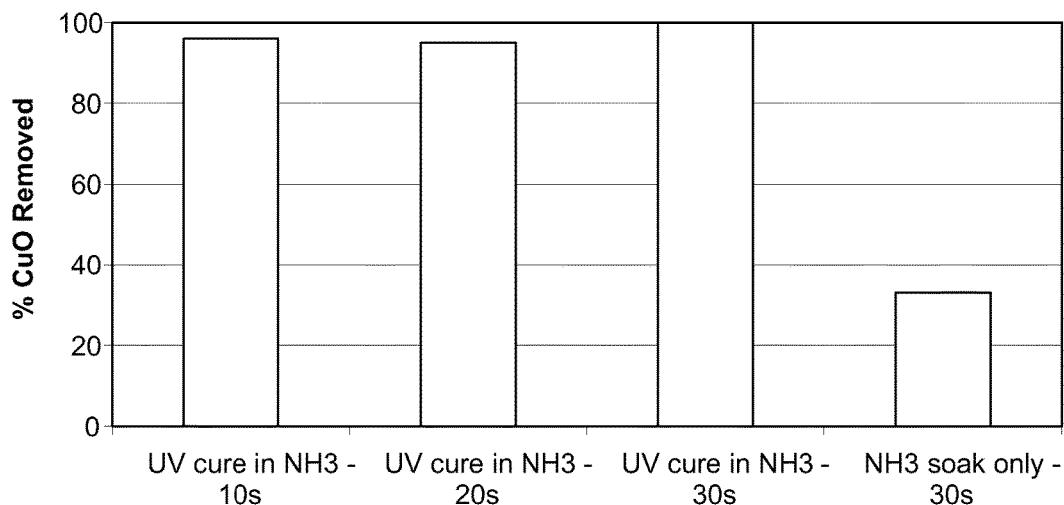
FIGS. 4-8 provide data plots illustrating the benefits of the present invention.

In order to evaluate metal oxide ($CuO_x$ in this case) removal, about 130 Å of CuO was grown using an oxidizing plasma on PVD Cu. The impact of different cure times, and impact with and without UV exposure were evaluated. The data are plotted in FIG. 4. Complete reduction of 130 Å of CuO was achieved in less than 30 s of UV cure in $NH_3$ atmosphere. (The slightly lower numbers for 10 and 20 s cures was due to incomplete removal right at the edge of the wafer, where the CuO was significantly thicker). By comparison, an $NH_3$ soak only (without UV exposure) for 30 s removes only one third of the CuO (about 40 Å).

Figure 5:
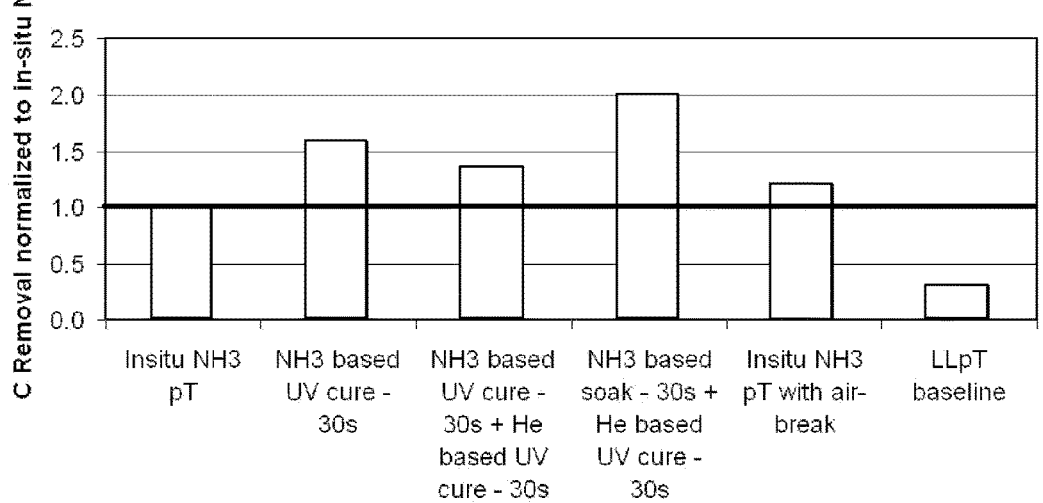

In order to evaluate CMP hydrocarbon residue removal, Cu wafers that had been through the CMP process were tested. Wafers were capped with SiN and then analyzed by SIMS. All results were compared against the direct plasma process ($NH_3$ based in-situ pre-treatment in this case). The data are plotted in FIG. 5. For the surface cleaning process, a UV cure in $NH_3$ (as a sample reducing agent) could potentially be implemented in multiple ways: single step UV cure in $NH_3$; UV cure in $NH_3$ followed by UV cure in an inert atmosphere like He; and $NH_3$ soak (no UV) followed by UV cure in an inert atmosphere. As the data indicates, C removal on all tests involving a reducing agent and UV cure was better than the direct plasma process ("in situ $NH_3$ pT").

The results presented above were all for 30s cure in $NH_3$ at 400° C. The actual time required and cure temperature will depend on the requirement. For example, in the case of C removal being the main requirement, shorter times can possibly be used. In cases wherein no C is present and very little O reduction necessary, shorter time and temperature can be used.

Figure 6:
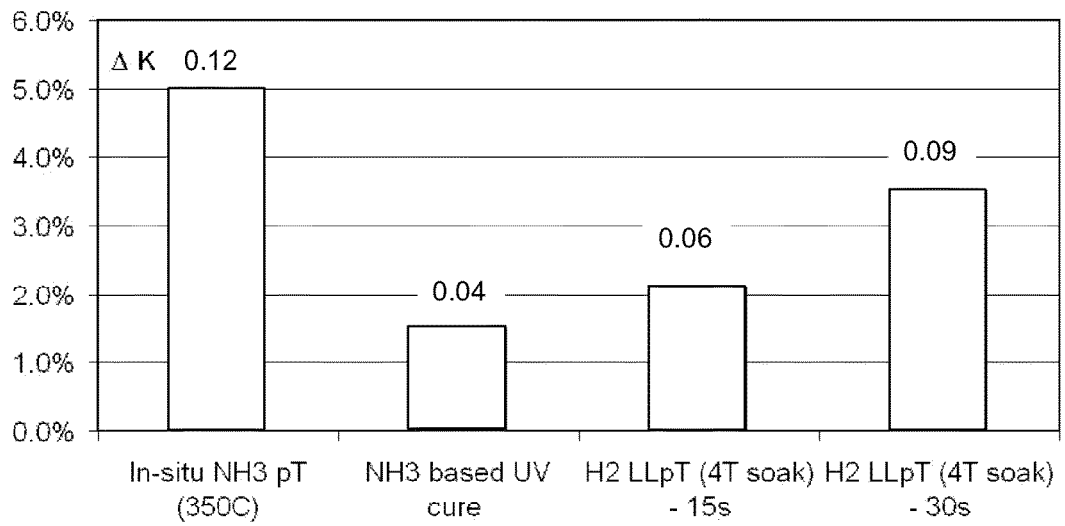
Figure 7:
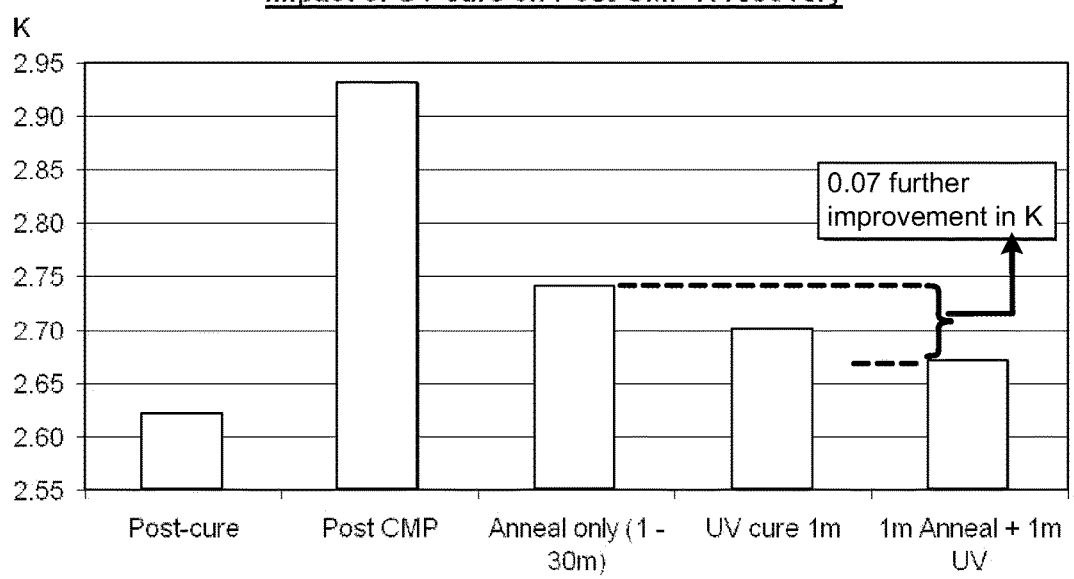

The data are presented in FIGS. 6 and 7. In order to evaluate k damage caused by the cleaning process, the UV-based process in a reducing atmosphere was compared to an in-situ plasma process. As FIG. 6 indicates, k damage was least for the film treated with a reducing agent and UV cure. K damage using the $NH_3$ based UV cure for 30s was the least (about 1.5%) compared to greater 5% for a direct plasma process. Further, as the FTIR data presented in the table below suggests, very little carbon loss was seen with the UV based pretreatment, which explains the low k damage:

| pT condition | Time (sec) | Si—CH3 conc. (~ bonds/cc) |
|---|---|---|
| Post cure | | 13.67 |
| NH3 based uV cure | 30 | 13.57 |
| H2 LLpT (4T soak) | 151 | 13.24 |

In order to evaluate dielectric damage repair (for k recovery) a 2.55 ULK film was tested. The treatment involved annealing the damaged low-k film for a short time (less than 1 minute) with $NH_3$ at about 400° C. followed by a short UV cure (less than 1 minute at about 400° C.) in this example. As FIG. 7 indicates, this leads to the largest recovery in k (recovery through anneal only saturates immaterial of anneal time).

Post-Trench Etch Processing

Figure 8:
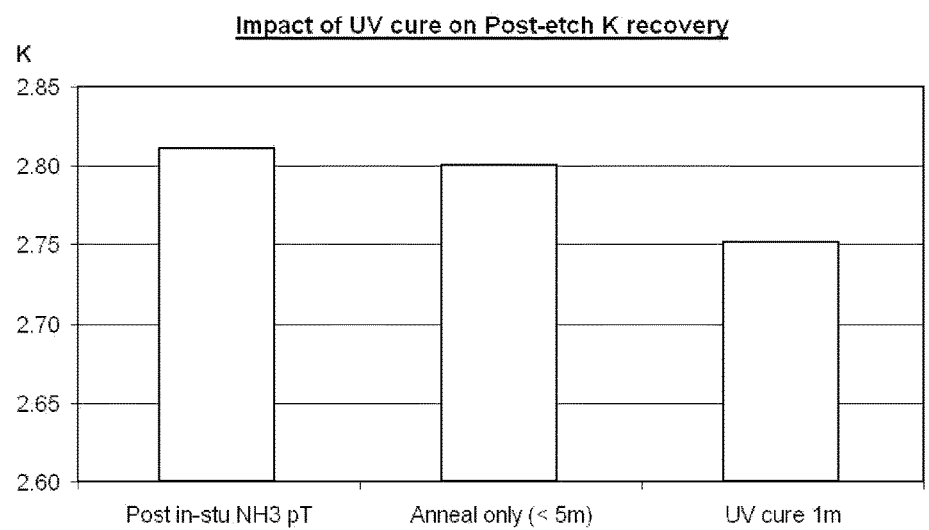

The same technique described above can also be used to recover at least some of the k from post-etch (pre-metallization) damage. Data of post-trench etch treatments in accordance with the present invention are plotted in FIG. 8. As the data indicates, k recovery was best for the film treated with a reducing agent and UV cure.

Conclusion

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of forming a semiconductor device, comprising:
receiving in a processing chamber a semiconductor device substrate comprising conductive features and a dielectric layer having formed therein a feature; and
exposing the semiconductor device substrate to a reducing agent and UV radiation, without exposing the device substrate to a plasma, wherein the reducing agent is a reducing gas selected from the group consisting of $NH_3$, $NH_2D$, $NHD_2$, $ND_3$, $H_2$, $N_2H_4$, and combinations of these with one another and/or inert gases, such that oxide on the conductive features is removed in a UV-mediated plasma-free process including exposure to a non-oxidizing reducing environment, wherein the UV and reducing agent exposure reduces oxide created in a via silicide.

2. A method of forming a semiconductor device, comprising:
receiving in a processing chamber a semiconductor device substrate comprising conductive features and a dielectric layer having formed therein a feature; and
exposing the semiconductor device substrate to a reducing agent and UV radiation, without exposing the device substrate to a plasma, wherein the reducing agent is a reducing gas selected from the group consisting of $NH_3$, $NH_2D$, $NHD_2$, $ND_3$, $H_2$, $N_2H_4$, and combinations of these with one another and/or inert gases, such that oxide on the conductive features is removed in a UV-mediated plasma-free process including exposure to a non-oxidizing reducing environment, and wherein the reducing agent is $NH_3$ gas, the exposure to the reducing agent is conducted at a temperature of about 400° C. for less than 1 minute, and the UV radiation exposure is conducted in an inert atmosphere.

3. A method of forming a semiconductor device, comprising:
receiving in a processing chamber a semiconductor device substrate comprising conductive features and a dielectric layer having formed therein a feature; and
exposing the semiconductor device substrate to a reducing agent and UV radiation, without exposing the device substrate to a plasma, wherein the reducing agent is a reducing gas selected from the group consisting of $NH_3$, $NH_2D$, $NHD_2$, $ND_3$, $H_2$, $N_2H_4$, and combinations of these with one another and/or inert gases, such that oxide on the conductive features is removed in a UV-mediated plasma-free process including exposure to a non-oxidizing reducing environment, and wherein the reducing gas is selected from the group consisting of $NH_2D$, $NHD_2$ and $ND_3$.

4. A method of forming a semiconductor device, comprising:

receiving in a processing chamber a semiconductor device substrate comprising conductive features and a dielectric layer having formed therein a feature; and exposing the semiconductor device substrate to a reducing agent and UV radiation, without exposing the device substrate to a plasma, wherein the reducing agent is a reducing gas selected from the group consisting of $NH_3$, $NH_2D$, $NHD_2$, $ND_3$, $H_2$, $N_2H_4$, and combinations of these with one another and/or inert gases, such that oxide on the conductive features is removed in a UV-mediated plasma-free process including exposure to a non-oxidizing reducing environment, and wherein the UV-mediated plasma-free process comprises exposing the oxide to hydrogen radicals.

5. A method of forming a semiconductor device, comprising:

receiving in a processing chamber a semiconductor device substrate comprising a planarized surface having conductive features in a dielectric layer; and exposing the planarized surface to UV radiation and a reducing agent, without exposing the planarized surface to a plasma, wherein the reducing agent is a reducing gas selected from the group consisting of $NH_3$, $NH_2D$, $NHD_2$, $ND_3$, $H_2$, $N_2H_4$, and combinations of these with one another and/or inert gases; whereby oxide on the conductive features is removed in a UV-mediated plasma-free process including exposure to a non-oxidizing reducing environment, wherein the UV-mediated plasma-free process comprises exposing the oxide to hydrogen radicals.

* * * * *